(12) United States Patent
Liu et al.

(10) Patent No.: US 11,367,846 B2
(45) Date of Patent: Jun. 21, 2022

(54) FILM LAYER ANALYSIS METHOD AND APPARATUS FOR ELECTROLUMINESCENT DEVICE, AND STORAGE MEDIUM

(71) Applicants: Chengdu BOE Optoelectronics Technology Co., Ltd., Sichuan (CN); BOE Technology Group Co., Ltd., Beijing (CN)

(72) Inventors: Ying Liu, Beijing (CN); Yuhang Peng, Beijing (CN); Congcong Du, Beijing (CN); Lei Fan, Beijing (CN); Chunfang Fan, Beijing (CN); Qi Wu, Beijing (CN); Xiaozhong Xue, Beijing (CN); Haoran Qin, Beijing (CN)

(73) Assignees: CHENGDU BOE OPTOELECTRONICS TECHNOLOGY CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 75 days.

(21) Appl. No.: 16/956,647

(22) PCT Filed: Nov. 1, 2019

(86) PCT No.: PCT/CN2019/115146
§ 371 (c)(1),
(2) Date: Jun. 22, 2020

(87) PCT Pub. No.: WO2020/093954
PCT Pub. Date: May 14, 2020

(65) Prior Publication Data
US 2020/0411304 A1    Dec. 31, 2020

(30) Foreign Application Priority Data
Nov. 5, 2018    (CN) .......................... 201811308434.2

(51) Int. Cl.
*H01L 51/50* (2006.01)

(52) U.S. Cl.
CPC ................................ *H01L 51/5012* (2013.01)

(58) Field of Classification Search
CPC ..... H01L 51/50; H01L 51/5012; G01N 27/62; H01J 49/142
See application file for complete search history.

(56) References Cited

U.S. PATENT DOCUMENTS

| | | | |
|---|---|---|---|
| 7,927,713 B2 * | 4/2011 | Ye | H01L 27/016 257/63 |
| 2013/0048964 A1 | 2/2013 | Takeda et al. | |

FOREIGN PATENT DOCUMENTS

| | | |
|---|---|---|
| CN | 101261239 A | 9/2008 |
| CN | 102539517 A | 7/2012 |
| | (Continued) | |

OTHER PUBLICATIONS

International search report of PCT application No. PCT/CN2019/115146 dated Jan. 10, 2020.

(Continued)

*Primary Examiner* — Changhyun Yi
(74) *Attorney, Agent, or Firm* — Fay Sharpe LLP (57) ABSTRACT

The present disclosure discloses a film layer analysis method for an electroluminescent device. The electroluminescent device includes an anode layer, an electroluminescent material layer, and a silver-bearing cathode layer that are sequentially laminated. The film layer analysis method includes stripping the silver-bearing cathode layer from the electroluminescent device by using a first ion sputtering source to obtain an analysis sample with the electroluminescent material layer exposed, and analyzing the exposed electroluminescent material layer by using a second ion sputtering source; wherein sputtering energy of the first ion sputtering (Continued)

source is greater than sputtering energy of the second ion sputtering source.

20 Claims, 6 Drawing Sheets

(56) References Cited

FOREIGN PATENT DOCUMENTS

| CN | 103155201 A | 6/2013 |
|---|---|---|
| CN | 109374724 A | 2/2019 |
| JP | 5084182 B2 | 11/2012 |
| JP | 5583550 B2 | 9/2014 |

OTHER PUBLICATIONS

First office action of Chinese application No. 201811308434.2 dated Nov. 28, 2019.
Song, Weijie et al. "Dynamic SIMS Characterization of Interface Structure of Ag/Alq$_3$/NPB/ ITO Model Devices" Surf. Interface Anal., vol. vol. 32, Dec. 31, 2001 (Dec. 31, 2001), pp. 103-104, and figures 1-3.
Ninomiy A, S. et al. "Analysis of Organic Semiconductor Multilayers with Ar Cluster Secondary Ion Mass Spectrometry" Surf: Interface Anal., vol. vol. 43, Jun. 22, 2010 (Jun. 22, 2010), pp. 95 and 97, and figures 1-3.
Michael Gellert, et al., "Charge Transfer across the Interface between $LiNi_{0.5}Mn_{1.5}O_4$ High-Voltage Cathode Films and Solid Electrolyte Films" Journal of The Electrochemical Society, Dec. 31, 2015; entire document.

\* cited by examiner

FILM LAYER ANALYSIS METHOD AND APPARATUS FOR ELECTROLUMINESCENT DEVICE, AND STORAGE MEDIUM

CROSS-REFERENCE TO RELATED APPLICATION

The present disclosure is a 371 of PCT Application No. PCT/CN2019/115146 filed on Nov. 1, 2019, which claims priority to Chinese Patent Application No. 201811308434.2, filed on Nov. 5, 2018 and entitled "FILM ANALYSIS METHOD FOR ELECTROLUMINESCENT DEVICE", the entire contents of which are incorporated herein by reference.

TECHNICAL FIELD

The present disclosure relates to the technical field of organic analysis, and more particularly, relates to a film layer analysis method for an electroluminescent device.

BACKGROUND

Electroluminescent devices are widely applied owing to their advantages of active luminescence, wide visible ranges, fast response and the like. The electroluminescent device includes an anode layer, an electroluminescent material layer and a cathode layer that are sequentially laminated. The electroluminescent material layer may be of various types, and may for example include: a hole transport layer, an organic luminescent layer, an electron transport layer, and the like that are sequentially laminated in a direction from the anode layer to the cathode layer.

SUMMARY

The present disclosure provides a film layer analysis method and apparatus for an electroluminescent device, and a storage medium thereof.

Embodiments of the present disclosure provide a film layer analysis method for an electroluminescent device. The electroluminescent device includes an anode layer, an electroluminescent material layer, and a silver-bearing cathode layer that are sequentially laminated. The film layer analysis method includes:

stripping the silver-bearing cathode layer from the electroluminescent device by using a first ion sputtering source to obtain an analysis sample with the electroluminescent material layer exposed; and analyzing the exposed electroluminescent material layer by using a second ion sputtering source;

wherein sputtering energy of the first ion sputtering source is greater than sputtering energy of the second ion sputtering source.

Optionally, stripping the silver-bearing cathode layer from the electroluminescent device by using the first ion sputtering source includes:

determining a sputtering stop time using a signal intensity-sputtering time graph while bombarding the silver-bearing cathode layer by using ions provided by the first ion sputtering source; and stopping bombarding the silver-bearing cathode layer by using the ions provided by the first ion sputtering source at the sputtering stop time.

Optionally, the silver-bearing cathode layer includes a non-silver metal sublayer and a silver-bearing metal sublayer that are sequentially disposed on the electroluminescent material layer.

Determining the sputtering stop time on the basis of the signal intensity-sputtering time graph includes:

determining an ion peak of a metal element of the non-silver metal sublayer in the signal intensity-sputtering time graph; and determining a time when the ion peak of the metal element of the non-silver metal sublayer occurs as the sputtering stop time.

Optionally, determining the sputtering stop time on the basis of the signal intensity-sputtering time graph includes:

determining an ion peak of a silver element in the signal intensity-sputtering time graph; and determining the sputtering stop time according to a time when the ion peak of the silver element occurs, the sputtering stop time following and being spaced from the time when the ion peak of the silver element occurs by a predetermined time period.

Optionally, the first ion sputtering source is a DSC source, and the second ion sputtering source is a gas-cluster ion source.

Optionally, the first ion sputtering source is an oxygen source.

Optionally, the second ion sputtering source is an argon ion cluster source.

Optionally, the first ion sputtering source and the second ion sputtering source belong to a same mass spectrometry.

Optionally, the mass spectrometry is a time-of-flight secondary ion mass spectrometry.

Optionally, analyzing the exposed electroluminescent material layer by using the second ion sputtering source includes:

determining composition and a layer position of each film layer of the electroluminescent material layer on the basis of the signal intensity-sputtering time graph provided by the time-of-flight secondary ion mass spectrometry.

Optionally, analyzing the exposed electroluminescent material layer by using the second ion sputtering source includes:

determining composition and a layer position of each film layer of the electroluminescent material layer on the basis of the signal intensity-sputtering time graph provided by the time-of-flight secondary ion mass spectrometry.

Optionally, analyzing the exposed electroluminescent material layer by using the second ion sputtering source includes:

determining a layer position of each film layer of the electroluminescent material layer on the basis of a 3D rendering diagram provided by the time-of-flight secondary ion mass spectrometry for characterizing an analysis process.

Optionally, analyzing the exposed electroluminescent material layer by using the second ion sputtering source includes:

determining element distribution of each film layer of the electroluminescent material layer through an element distribution diagram corresponding to the 3D rendering diagram provided by the time-of-flight secondary ion mass spectrometry.

Optionally, a stripping area of the silver-bearing cathode layer is greater than or equal to an analysis area of the electroluminescent material layer.

Optionally, the electroluminescent device further includes an encapsulation layer laminated on the silver-bearing cathode layer.

The film layer analysis method further includes removing the encapsulation layer by using a blade before stripping the silver-bearing cathode layer.

Embodiments of the present disclosure provide another film layer analysis method for an electroluminescent device. The electroluminescent device includes an anode layer, an electroluminescent material layer, and a silver-bearing cathode layer that are sequentially laminated.

The film layer analysis method includes:

providing a time-of-flight secondary ion mass spectrometry having a DSC source and a gas-cluster ion source;

stripping the silver-bearing cathode layer from the electroluminescent device by using the DSC source to obtain an analysis sample with the electroluminescent material layer exposed; and analyzing the exposed electroluminescent material layer by using the gas-cluster ion source.

Optionally, the silver-bearing cathode layer includes a Yb layer and a MgAg alloy layer sequentially disposed on the electroluminescent material layer;

an ion peak of Yb element is determined in a signal intensity-sputtering time graph while bombarding the silver-bearing cathode layer by using ions provided by the DSC source; and bombarding of the silver-bearing cathode layer by using ions provided by the DSC source is stopped when the ion peak of the Yb element occurs.

Optionally, the DSC source is an oxygen source, and the gas-cluster ion source is an argon ion cluster source.

Optionally, analyzing the exposed electroluminescent material layer by using the gas-cluster ion source includes:

determining composition and a layer position of each film layer of the electroluminescent material layer on the basis of the signal intensity-sputtering time graph provided by the time-of-flight secondary ion mass spectrometry;

determining a layer position of each film layer of the electroluminescent material layer on the basis of a 3D rendering diagram provided by the time-of-flight secondary ion mass spectrometry for characterizing an analysis process; and determining element distribution of each film layer of the electroluminescent material layer through an element distribution diagram corresponding to the 3D rendering diagram provided by the time-of-flight secondary ion mass spectrometry.

Embodiments of the present disclosure further provide a film layer analysis apparatus for an electroluminescent device. The electroluminescent device includes an anode layer, an electroluminescent material layer, and a silver-bearing cathode layer that are sequentially laminated.

The film layer analysis apparatus includes:

a stripping module, configured to strip the silver-bearing cathode layer from the electroluminescent device by using a first ion sputtering source to obtain an analysis sample with the electroluminescent material layer exposed; and an analyzing module, configured to analyze the exposed electroluminescent material layer by using a second ion sputtering source;

wherein sputtering energy of the first ion sputtering source is greater than sputtering energy of the second ion sputtering source.

Optionally, the stripping module includes:

a sputtering stop time determining submodule, configured to determine a sputtering stop time based on a signal intensity-sputtering time graph, the signal intensity-sputtering time graph being generated while bombarding the silver-bearing cathode layer by using ions provided by the first ion sputtering source; and a sputtering control submodule, configured to stop bombarding the silver-bearing cathode layer by using ions provided by the first ion sputtering source at the sputtering stop time determined by the sputtering stop time determining submodule.

Optionally, the sputtering stop time determining submodule is configured to determine an ion peak of a metal element of the non-silver metal sublayer in the signal intensity-sputtering time graph, and determine a time when the ion peak of the metal element of the non-silver metal sublayer occurs as the sputtering stop time.

Optionally, the sputtering stop time determining submodule is configured to determine an ion peak of a silver element in the signal intensity-sputtering time graph, and determine the sputtering stop time according to a time when the ion peak of the silver element occurs, the sputtering stop time following and being spaced from the time when the ion peak of the silver element occurs by a predetermined time period.

Optionally, the first ion sputtering source is a dual-sputtering column DSC source, and the second ion sputtering source is a gas-cluster ion source.

Optionally, the first ion sputtering source is an oxygen source.

Optionally, the second ion sputtering source is an argon ion cluster source.

Optionally, the first ion sputtering source and the second ion sputtering source belong to a same mass spectrometry.

Optionally, the mass spectrometry is a time-of-flight secondary ion mass spectrometry. Embodiments of the present disclosure further provide a n apparatus for use in film layer analysis for an electroluminescent device. The electroluminescent device includes an anode layer, an electroluminescent material layer, and a silver-bearing cathode layer that are sequentially laminated.

The apparatus includes:

a processor; and a memory for storing at least one processor-executable instruction;

wherein the processor is configured to execute the at least one instruction stored in the memory to perform the film layer analysis method.

Embodiments of the present disclosure further provide a non-transitory computer readable storage medium in which at least one instruction is stored, wherein when the at least one instruction is executed on a processing component, the processing component is enabled to perform the film layer analysis method.

DETAILED DESCRIPTION

For clearer descriptions of the technical solutions and advantages of the present disclosure, the embodiments of the present disclosure will be described in detail below with reference to the accompanying drawings.

The electroluminescent material layer has a direct impact on luminescent performance of the electroluminescent device, so a mass spectrometry is widely applied in the related art for analyzing composition of each film layer of the electroluminescent material layer in the electroluminescent device. Before the analysis, the cathode layer shall be stripped off by using a blade or adhesive tape because most of the cathode layer contains a silver element and the characteristic ion peak of silver may interfere the characteristic ion peak of the composition in the electroluminescent material layer.

However, while stripping the cathode layer by using the blade or adhesive tape, it may easily happen that the cathode layer fails to be stripped thoroughly or the electroluminescent material layer is partially stripped.

To this end, an embodiment of the present disclosure provides a film layer analysis method for an electroluminescent device, which can effectively and thoroughly remove the silver-bearing cathode layer without affecting the electroluminescent material layer.

The electroluminescent device according to an embodiment of the present disclosure includes: an anode layer, an electroluminescent material layer, and a silver-bearing cathode layer that are sequentially laminated. The electroluminescent material layer may be of various types. For example, the electroluminescent material layer includes, but is not limited to, the followings: a hole transport layer, an organic luminescent layer, and an electron transport layer that are sequentially laminated in a direction from the anode layer to the cathode layer; a hole injection layer, a hole transport layer, an organic luminescent layer, an electron transport layer, and an electron injection layer that are sequentially laminated in a direction from the anode layer to the cathode layer; or a hole transport layer, an organic luminescent layer, a hole block layer, and an electron transport layer that are sequentially laminated in a direction from the anode layer to the cathode layer.

Figure 1:
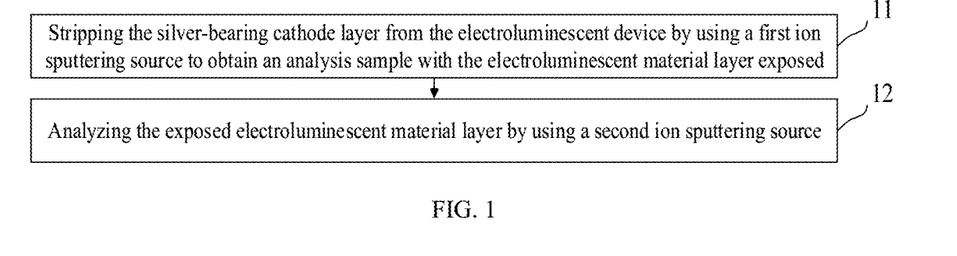
FIG. 1 is a flowchart of an exemplary film layer analysis method for an electroluminescent device according to the present disclosure.

For the aforesaid electroluminescent device, an embodiment of the present disclosure provides a film layer analysis method. FIG. 1 is a flowchart of an exemplary film layer analysis method for an electroluminescent device according to the present disclosure. As shown in FIG. 1, the film layer analysis method includes following steps.

In step 11, a silver-bearing cathode layer is stripped from the electroluminescent device by using a first ion sputtering source to obtain an analysis sample by using the electroluminescent material layer exposed.

In step 12, the exposed electroluminescent material layer is analyzed by using a second ion sputtering source.

Sputtering energy of the first ion sputtering source is greater than sputtering energy of the second ion sputtering source.

The film layer analysis method for the electroluminescent device according to the embodiment of the present disclosure can analyze composition of each film layer of the electroluminescent material layer. Before the analysis, the silver-bearing cathode layer is stripped by sputtering by using the first ion sputtering source that has a greater sputtering energy, and the stripping process is stable and controllable, which can not only remove the silver-bearing cathode layer effectively but also prevent the electroluminescent material layer from being stripped. Then, the exposed electroluminescent material layer is analyzed by using a second ion sputtering source having a lower sputtering energy, which can obtain composition and layer position of each film layer of the electroluminescent material layer without causing damages to molecular structure of the electroluminescent material layer, thereby ensuring accuracy of the analysis result.

The level of sputtering energy herein may be measured by a degree of difficulty in etching the metal layer and a degree of damage caused to the molecular structure of the electroluminescent material layer during the etching process. According to the embodiment of the present disclosure, the sputtering energy of the first ion sputtering source is able to etch both the metal layer and the electroluminescent material layer and may cause damages to the molecular structure of the electroluminescent material layer while etching the electroluminescent material layer. The sputtering energy of the second ion sputtering source can hardly etch the metal layer but easily etch the electroluminescent material layer, and causes no damage to the molecular structure of the electroluminescent material layer while etching the electroluminescent material layer.

The first ion sputtering source and the second ion sputtering source are different sputtering sources. Exemplarily, the first ion sputtering source may be a dual-sputtering column (DSC) source, and the second ion sputtering source may be a gas-cluster ion source, also known as a gas-cluster ion beam (GCIB) source.

Regarding the DSC source, it includes but is not limited to an oxygen source, a cesium source (Cs source) and the like, as long as it can achieve the purpose of removing the silver-bearing cathode layer by sputtering. Exemplarily, the ion sputtering source may be an oxygen source because the oxygen source has a high energy and thereby has a good stripping effect on the silver metal, and the oxygen source has a high response to the cation and thereby is conducive to detection of the stripping depth of Ag+.

Regarding the gas-cluster ion source, the gas-cluster ion source used in the embodiment of the present disclosure is an argon ion cluster source because the argon ion cluster source has a relatively low energy and causes no damage to the molecular structure of the organic substance under the premise of analyzing composition of the organic substance of each film layer.

Exemplarily, the film layer analysis method may include: providing a mass spectrometry having a DSC source and a gas-cluster ion source, stripping the silver-bearing cathode layer from the electroluminescent device by using the DSC source to obtain an analysis sample with the electroluminescent material layer exposed, and analyzing the exposed electroluminescent material layer by using the gas-cluster ion source. That is, the first ion sputtering source and the second ion sputtering source belong to the same mass spectrometry. Thus, stripping the silver-bearing cathode layer and analyzing the electroluminescent material layer are implemented by the same mass spectrometry, which does not require changing the equipment between two sputtering operations, and thereby reduces the operation steps and improves the analysis efficiency.

The time-of-flight secondary ion mass spectrometry (TOF-SIMS) is able to implement static analysis of the sample with almost no damage. In addition, the current time-of-flight secondary ion mass spectrometry generally has both of the DSC source and the gas-cluster ion source and provides during the sputtering and analysis process a mass spectrum, a signal intensity-sputtering time graph (also understood as a depth graph), a 3D rendering diagram, a 2D plane diagram and the like for characterizing the sputtering and analysis process, such that the sputtering and analysis process can be calibrated from a plurality angles to achieve a better accuracy. Under this consideration, the mass spectrometry adopted in the embodiment of the present disclosure may be the TOF-SIMS.

Figure 2:
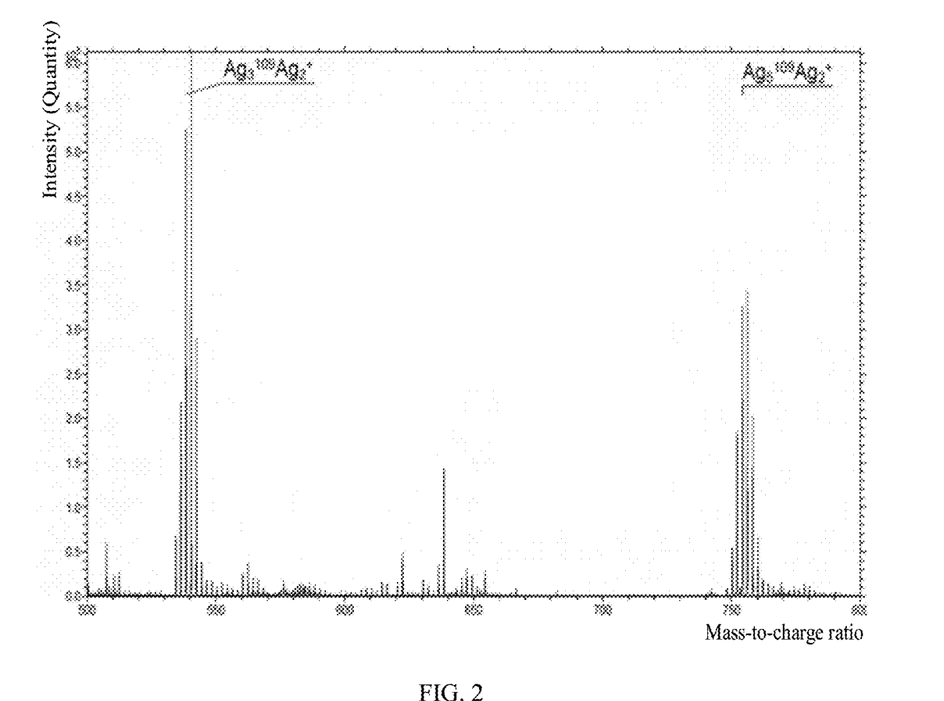
FIG. 2 is a mass spectrum exemplarily obtained by sputtering from a cathode layer to an anode layer by using a DSC source.

In order to determine the effectiveness of the ion sputtering source in sputtering the silver-bearing cathode layer, the embodiment of the present disclosure performs a sputtering experiment on the electroluminescent device including the silver-bearing cathode layer and the silver-bearing anode layer, and adopts a time-of-flight secondary ion mass spectrometry to provide a corresponding mass spectrum. FIG. 2 is a mass spectrum exemplarily obtained by sputtering a cathode layer to an anode layer by using a DSC source. As shown in FIG. 2, the silver-bearing cathode layer and the silver-bearing anode layer both have Ag polymer peaks (corresponding to the $Ag_3^{109} Ag_2^+$ peak and the $Ag_5^{109} Ag_2^+$ peak), which indicates that both of them are effectively sputtered.

Figure 3:
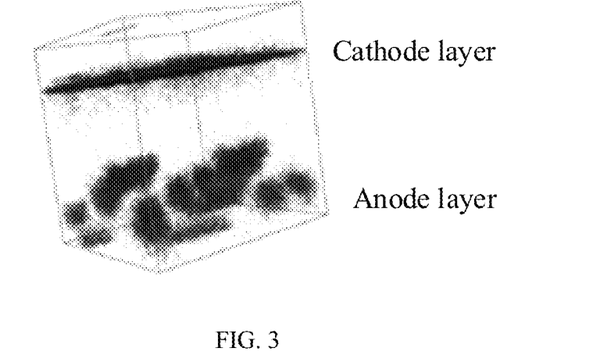
FIG. 3 is a 3D rendering diagram corresponding to $Ag_3^{109}Ag_2^+$ peak in FIG. 1.
Figure 4:
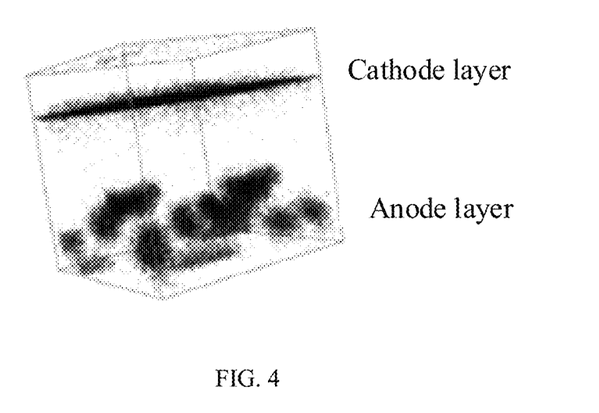
FIG. 4 is a 3D rendering diagram corresponding to $Ag_5^{109}Ag_2^+$ peak in FIG. 1.

Optionally, the time-of-flight secondary ion mass spectrometry may also be used to provide a 3D rendering diagram corresponding to the sputtering experiment. FIG. 3 is a 3D rendering diagram corresponding to the $Ag_3^{109} Ag_2^+$ peak in FIG. 2, and FIG. 4 is a 3D rendering diagram corresponding to the $Ag_5^{109} Ag_2^+$ peak in FIG. 2. The 3D rendering diagram may show the layer position of the layer that has been removed by sputtering, namely, the layer position that the sputtering depth reaches. Since the cathode layer and the anode layer are both shown in FIGS. 3 and 4, FIGS. 3 and 4 may indicate that the sputtering depth has reached the anode layer from the cathode layer. As shown in FIG. 3, the cathode layer and the anode layer both have the $Ag_3^{109} Ag_2^+$ peak; and as shown in FIG. 4, the cathode layer and the anode layer both have the $Ag_5^{109} Ag_2^+$ peak. This also indicates that the cathode layer and the anode layer can be effectively sputtered by the DSC source.

For the process of stripping the sliver-bearing cathode layer, a sputtering stop time of the silver-bearing cathode layer may be determined using a signal intensity-sputtering time graph while stripping the sliver-bearing cathode layer from the electroluminescent device by using the first ion sputtering source, namely, while bombarding the silver-bearing cathode layer by using the ions provided by the first ion sputtering source. Then, sputtering of the first ion sputtering source is stopped at the sputtering stop time. That is, bombarding of the silver-bearing cathode layer by using the ions provided by the first ion sputtering source is stopped at the sputtering stop time, and the signal intensity-sputtering time graph may be provided by the time-of-flight secondary ion mass spectrometry.

Since the mass spectrometry as adopted is the time-of-flight secondary ion mass spectrometry, the signal intensity-sputtering time graph (also understood as the depth graph) may be provided while stripping the silver-bearing cathode layer. By analyzing the signal intensity-sputtering time graph, the sputtering time when the signal intensity of a substance decreases from the peak value may indicate that the substance is about to be stripped off. Thus, owing to the signal intensity-sputtering time graph, the sputtering stop time of the silver-bearing cathode layer can be effectively determined, which thereby prevents the silver-bearing cathode layer from being stripped by halves and further prevents the electroluminescent material layer underneath from being stripped. The signal intensity-sputtering time graph is used to characterize composition of the film layer at the sputtering depth as reached at the sputtering time.

In a possible implementation, determining the sputtering stop time of the silver-bearing cathode layer on the basis of the signal intensity-sputtering time graph includes following steps.

The ion peak of the Ag element is determined according to the signal intensity-sputtering time graph, and the sputtering stop time of the silver-bearing cathode layer is determined according to the time when the ion peak of the Ag element occurs.

Figure 5:
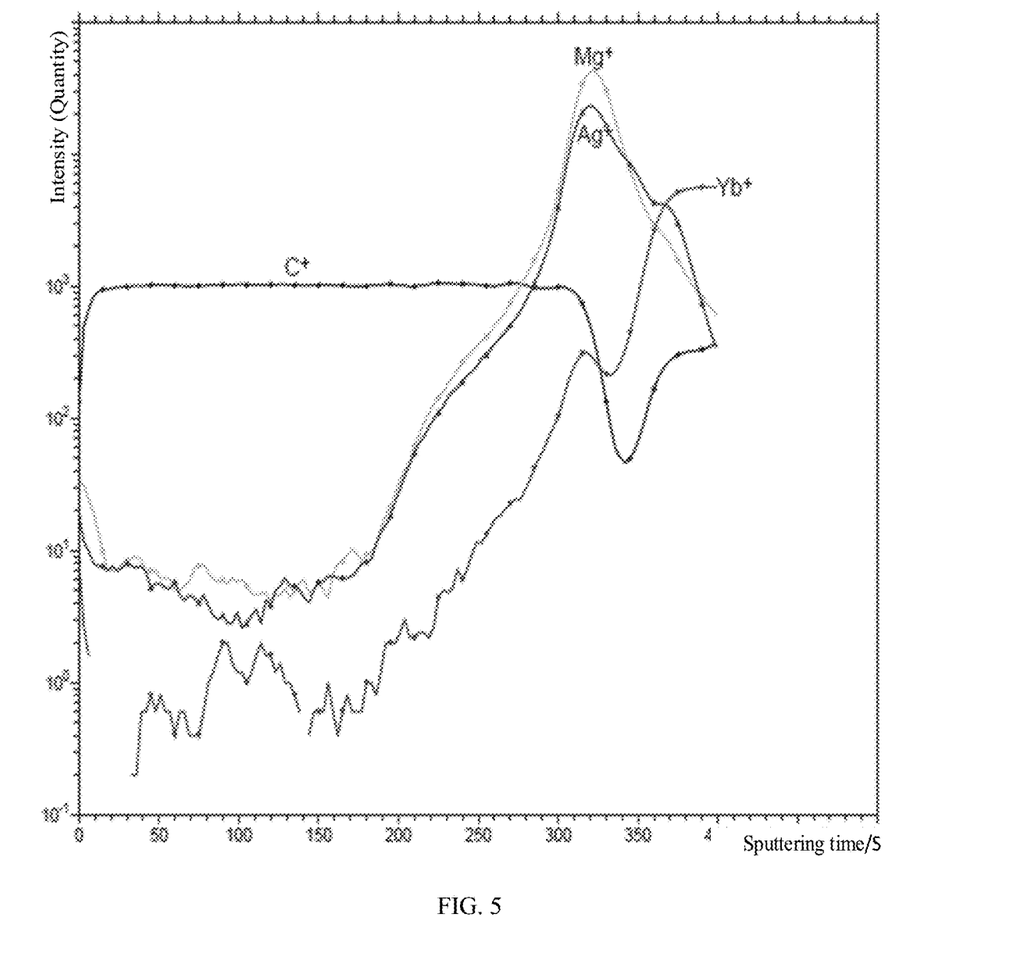
FIG. 5 is a signal intensity-sputtering time graph exemplarily obtained by sputtering a silver-bearing cathode layer by using a DSC source.

FIG. 5 is a signal intensity-sputtering time graph exemplarily obtained by sputtering a silver-bearing cathode layer by using a DSC source. As shown in FIG. 5, according to the signal intensity-sputtering time graph, when the ion peak of the Ag element occurs, it indicates that the silver element is about to be stripped off. At this point, it may be determined that the sputtering of the silver-bearing cathode layer is basically completed. Thus, the sputtering stop time of the silver-bearing cathode layer may be the time when the ion peak of the Ag element occurs, or a certain time after the ion peak of the Ag element occurs, which namely means that the sputtering stop time is after and separated from the time when the ion peak of the silver element occurs by a predetermined time period. Of course, the silver element is removed more thoroughly at the certain time after the ion peak occurs. The predetermined time period herein may be an empirical value set according to the thickness and composition of the silver-bearing cathode layer; or the predetermined time period may be obtained through a sputtering experiment.

In general, the silver-bearing cathode layer not only includes the silver element but also other elements. For example, the silver-bearing cathode layer may include a non-silver metal sublayer (for example, a Yb layer) and a silver-bearing metal sublayer (for example, a Mg—Ag layer) disposed on the electroluminescent material layer in sequence. That is, the composition of the silver-bearing cathode layer is Mg—Ag—Yb.

In the silver-bearing cathode layer, since the non-silver metal sublayer is below the silver-bearing metal sublayer, the ion peak of the metal element occurs later than the ion peak of the silver element in the non-silver metal sublayer. Under this case, the certain time after the ion peak of the Ag element occurs may be determined by referring to the time when the ion peak of the metal element in the non-silver metal sublayer occurs.

For example, in the silver-bearing cathode layer, the layer where the Yb element is disposed is below the layer where the Ag element is disposed, so the ion peak of the Yb element occurs later than the ion peak of the Ag element. The time when the ion peak of the Yb element occurs may be determined according to the signal intensity-sputtering time graph. According to the time when the ion peak of the Yb element occurs, it may be determined that the silver-bearing cathode layer is about to be stripped off, and the sputtering operation of the silver-bearing cathode layer may be stopped at this point.

It can be seen from FIG. 5 that the ion peaks of the Mg element and the Ag element occur at the same time, so the Mg element and the Ag element are disposed in the same layer. In addition, the ion peak of the Yb element occurs later than the ion peak of the Ag element, which indicates that the Yb layer is below the Ag-bearing layer. Since the Yb layer is relatively thin, the sputtering of the first sputtering source shall be stopped at the moment of observing the ion peak of the Yb element, such that the striping the silver-bearing cathode layer may be completed in time without causing damages to the electroluminescent material layer under consideration of the actual reaction and operation time of the person. Hence, the time when the ion peak of the Yb element occurs may serve as the sputtering stop time.

It should be noted that the stripping of the silver-bearing cathode layer by using the first ion sputtering source and the analysis of the electroluminescent material layer by using the second ion sputtering source in the embodiment of the present disclosure are both implemented by manually operating the mass spectrometry, or by automatically controlling the mass spectrometry by using a control device. If the mass spectrometry is automatically controlled by the control device, the control device shall be able to send a control command to the mass spectrometry, such as, a sputtering start command, a sputtering stop command, or the like. These commands may carry the identification of the corresponding sputtering source. In addition, the control device shall also have a pattern recognition capability to identify in the signal intensity-sputtering time graph the ion peaks of the elements as required.

Furthermore, a 3D rendering diagram for characterizing the stripping process is provided by the time-of-flight secondary ion mass spectrometry while stripping the silver-bearing cathode layer from the electroluminescent device by using the first ion sputtering source, such that the layer position of each layer in the silver-bearing cathode layer is determined based on the 3D rendering diagram.

Figure 6:
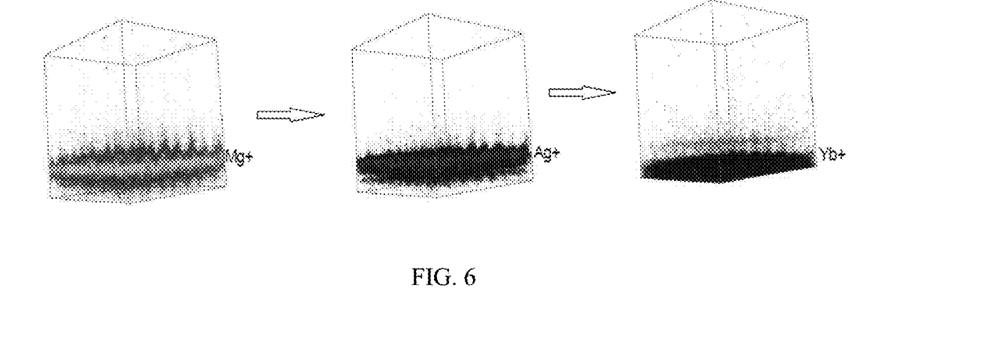
FIG. 6 is a 3D rendering diagram for characterizing a sputtering process involved in FIG. 5.

For example, FIG. 6 is a 3D rendering diagram for characterizing a sputtering process involved in FIG. 5. As shown in FIG. 6, the Mg+ and Ag+ have the same layer position, which means that they are on the same layer; and Yb+ is disposed on the bottom layer, which is namely below the layer where Mg+ and Ag+ are disposed. The 3D rendering diagram provided by the time-of-flight secondary ion mass spectrometry for characterizing the stripping process can further help to confirm whether the silver-bearing cathode layer is effectively and thoroughly stripped, thereby improving the controllability of the stripping process of the silver-bearing cathode layer.

The signal intensity-sputtering time graph is provided by the time-of-flight secondary ion mass spectrometry while analyzing the exposed electroluminescent material layer by using the gas-cluster ion source, and then, composition and a layer position of each film layer of the electroluminescent material layer are determined on the basis of the signal intensity-sputtering time graph.

The time-of-flight secondary ion mass spectrometry may provide the signal intensity-sputtering time graph (also understood as a depth graph) while analyzing each film layer of the electroluminescent material layer by using the gas-cluster ion source. By analyzing the signal intensity-sputtering time graph, the sputtering time corresponding to the signal intensity peak value of each film layer can be obtained, and according to the sputtering times arranged in chronological order, it may be determined that the film layers have been analyzed one by one, such that the layer position of each film layer can be determined. In addition, the composition of each film layer may be determined on the basis of the peak value of the respective signal intensity.

Figure 7:
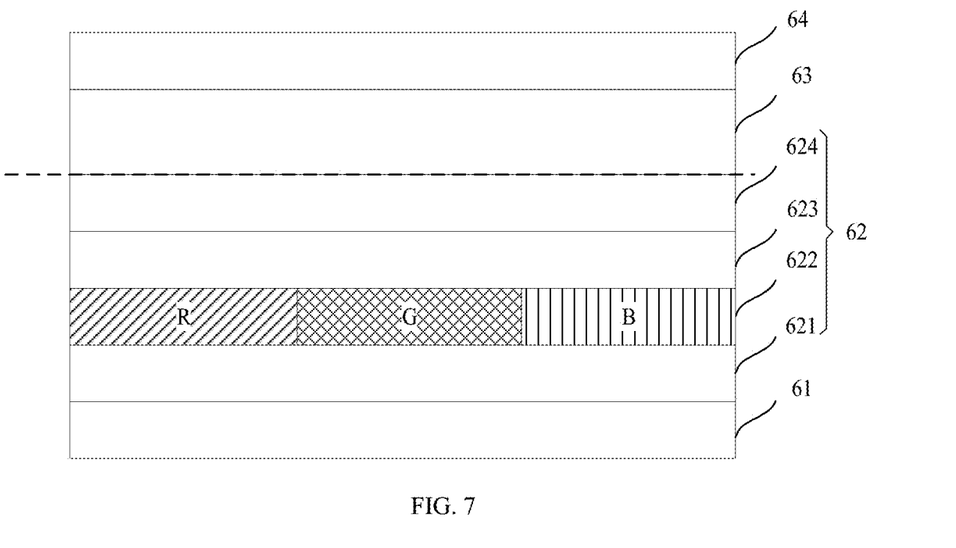
FIG. 7 is a diagram of an exemplary structure of film layers of an electroluminescent device.

FIG. 7 is a diagram of an exemplary structure of film layers of an electroluminescent device. As shown in FIG. 7, the electroluminescent device includes an anode layer 61, an electroluminescent material layer 60, and a silver-bearing cathode layer 63 that are sequentially laminated. The electroluminescent material layer includes a hole transport layer 621, an organic luminescent layer 622, a hole block layer 623, and an electron transport layer 624 that are sequentially disposed on the anode layer 61. The organic luminescent layer 622 is a composite material layer formed of three materials, and the electron transport layer 624 is formed of Liq.

Figure 8:
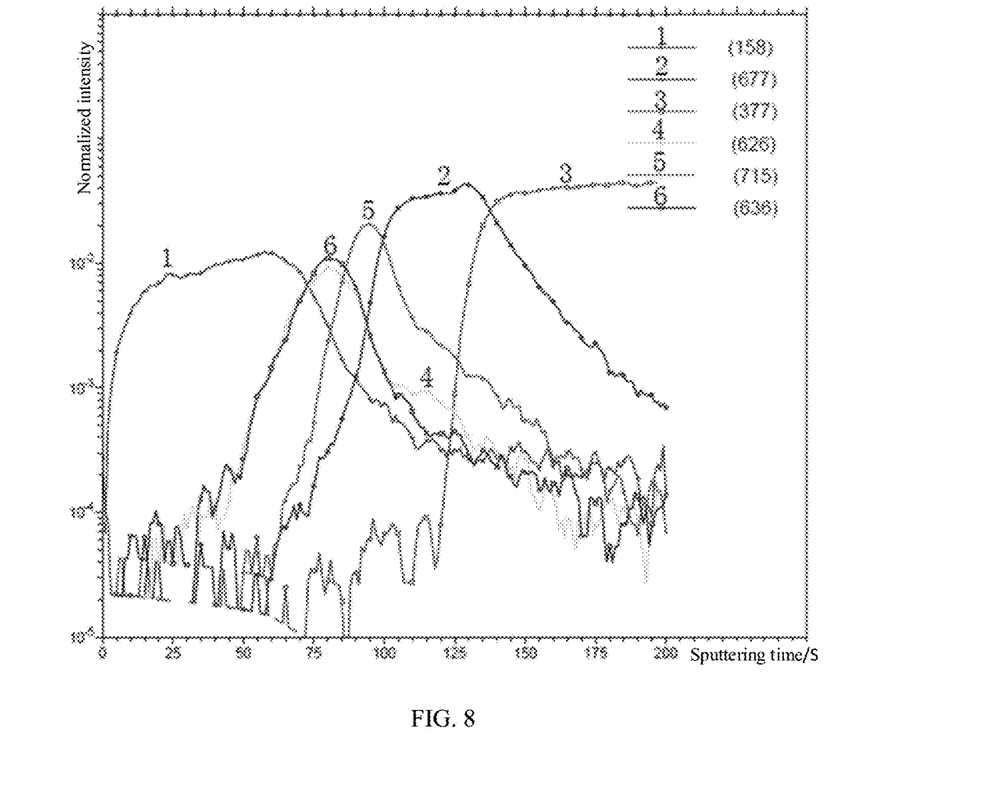
FIG. 8 is a signal intensity-sputtering time graph exemplarily obtained by analyzing an electroluminescent material layer by using a gas-cluster ion source.

FIG. 8 illustrates the signal intensity-sputtering time graph obtained for the electroluminescent material layer in FIG. 7. As shown in FIG. 8, as the sputtering time increases, six characteristic peaks corresponding to the six kinds of composition occur in sequence. Exemplarily, the curve 1 represents composition of the first film layer after removing the silver-bearing cathode layer 63 (i.e., composition of the electron transport layer 624, which has a corresponding mass-to-charge ratio of 158). Curves 6, 4 and 5 represent composition of the third film layer (i.e., composition of the organic luminescent layer 622, and the mass-to-charge ratios corresponding to curves 6, 4, and 5 are 636, 626, and 715, respectively). As can be seen from FIG. 7, the composition corresponding to curves 6 and 4 occur at the same time, which indicates that the two kinds of composition occur in the same layer; and the composition corresponding to curve 5 occur later, which indicates that the organic luminescent layer 622 has a double-layer structure, with one layer formed by the composition corresponding to curve 5 and the other layer formed by the composition corresponding to curves 6 and 4. Curve 2 represents composition of the fourth film layer (i.e., the composition of the hole transport layer 621, which has a corresponding mass-to-charge ratio of 677); and curve 3 represents composition of the fifth film layer (i.e., the composition of ITO in the anode layer 61, which has a corresponding mass-to-charge ratio of 377).

It should be noted that the hole block layer 623 is omitted because it is thin and difficult to display in FIG. 7. The position where the peak value corresponding to the composition of the hole block layer 623 occurs is between the peak value of curve 1 and the peak value of curve 6, and the mass-to-charge ratio corresponding to the composition of the hole block layer 623 is 578.

The layer relationship between the film layers as obtained from FIG. 8 is consistent with the layer relationship in the structure shown in FIG. 7, which indicates that the method according to the embodiments of the present disclosure achieves an effective analysis of the electroluminescent material layer including a plurality of film layers.

Figure 9:
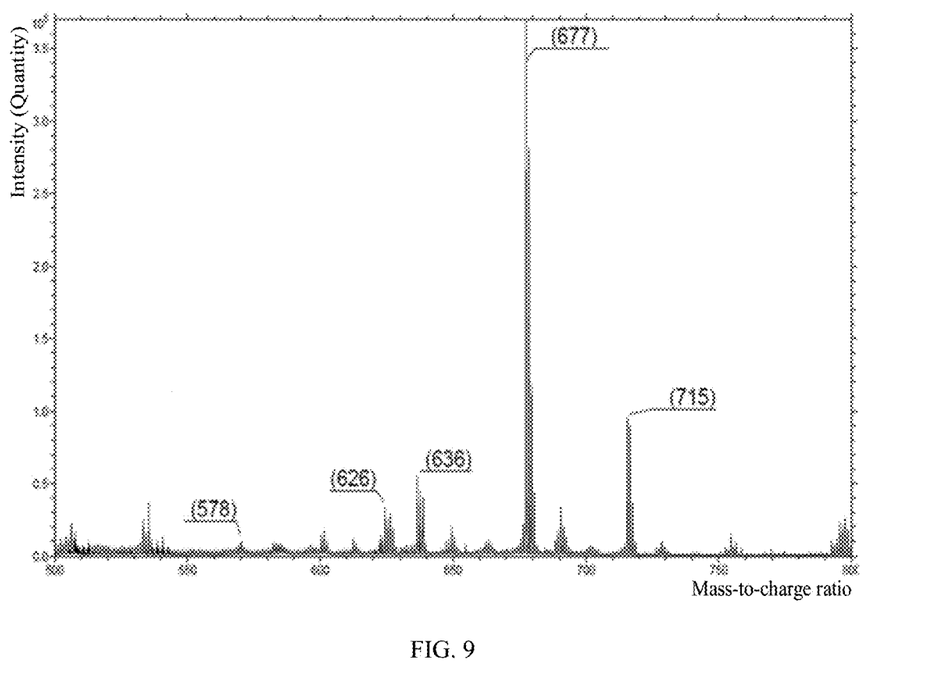
FIG. 9 is a mass spectrum of an electroluminescent material layer corresponding to FIG. 8.

The characteristic peak of each film layer of the electroluminescent material layer is generally in the mass-to-charge ratio range of 500-900 m/z. For the process of analyzing each film layer of the electroluminescent material layer, in order to judge effectiveness of the analysis performed by the gas-cluster ion source on the electroluminescent material layer, the embodiment of the present disclosure intercepts a mass spectrum in the mass-to-charge ratio range of 500-900 m/z from the mass spectrum provided by the time-of-flight secondary ion mass spectrometry. As shown in FIG. 9, five characteristic peaks may be obtained within the mass-to-charge ratio range of 500-900 m/z by analyzing by using the gas-cluster ion source. Since the composition of the electron transport layer 624 and the mass-to-charge ratio of ITO in the anode layer 61 fail to fall into the range of 500-900 m/z, FIG. 9 does not include characteristic peaks of the two layers and only include characteristic peaks of the other five kinds of composition. The five mass-to-charge ratios corresponding to the five characteristic peaks correspond to the hole block layer 623, the organic luminescent layer 622, and the hole transport layer 621, respectively, the organic luminescent layer 622 herein corresponding to three mass-to-charge ratios. This proves the effectiveness of the method according to the embodiment of the present disclosure in analyzing the electroluminescent material layer.

Figure 10:
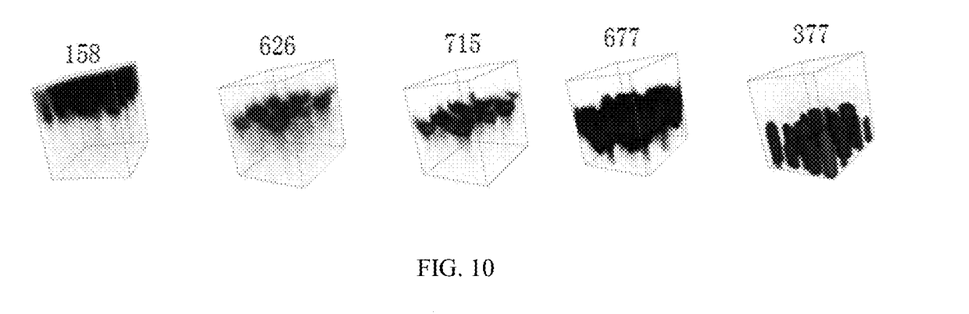
FIG. 10 is a 3D rendering diagram for characterizing an analysis process involved in FIG. 8.

Optionally, the 3D rendering diagram is provided by the time-of-flight secondary ion mass spectrometry for charactering the analysis process while analyzing the exposed electroluminescent material layer by using the gas-cluster ion source, and then, the layer position of each film layer of the electroluminescent material layer may be determined on the basis of the 3D rendering diagram. FIG. 10 shows a 3D rendering diagram corresponding to the five film layers in FIG. 7. As shown in FIG. 10, in a direction from top to bottom in the figure, the composition corresponding to 158 is disposed at the uppermost first layer; the composition corresponding to 626 is disposed at the second layer; the composition corresponding to 715 is disposed at the third layer; the composition corresponding to 677 is disposed at the fourth layer; and the composition corresponding to 377 is disposed at the fifth layer. Thus, the sequence herein is consistent with the sequence in which the layers occur in FIG. 7. Thus, the 3D rendering diagram provided by the time-of-flight secondary ion mass spectrometry for characterizing the analysis process can further help to confirm the layer position of each film layer of the electroluminescent material layer, and thereby improve the accuracy of the analysis process.

Figure 11:
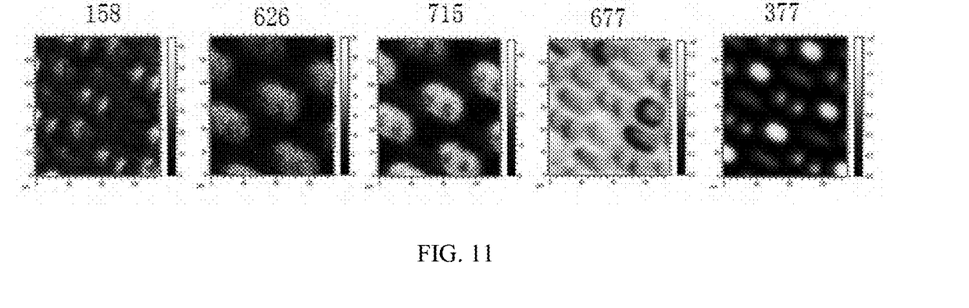
FIG. 11 is an element distribution diagram corresponding to the 3D rendering diagram involved in FIG. 10.

Optionally, an element distribution diagram corresponding to the 3D rendering diagram is provided by the time-of-flight secondary ion mass spectrometry while analyzing the exposed electroluminescent material layer by using the gas-cluster ion source, and then, element distribution of each film layer of the electroluminescent material layer may be determined on the basis of the element distribution diagram. FIG. 11 is an element distribution diagram corresponding to the 3D rendering diagram involved in FIG. 10. It can be seen from FIG. 11 that the element distribution morphology of each film layer is consistent with the morphology in the corresponding 3D rendering diagram in FIG. 10. Thus, by providing the element distribution diagram corresponding to the 3D rendering diagram using the time-of-flight secondary ion mass spectrometry, element distribution of each film layer of the electroluminescent material layer may be determined more intuitively on the basis of the element distribution diagram, which thereby improves the accuracy in determining the composition of each film layer.

In addition, in the embodiment of the present disclosure, the stripping area of the silver-bearing cathode layer may be greater than or equal to the analysis area of the electroluminescent material layer, such that the analysis region of the electroluminescent material layer may be disposed within, for example, in the middle of, the stripping region of the silver-bearing cathode layer. The stripping area of the silver-bearing cathode layer is configured to be greater than or equal to the analysis area of the electroluminescent material layer, which ensures that the silver-bearing cathode layer is thoroughly stripped from the electroluminescent material layer as analyzed, thereby ensuring the analysis accuracy.

For example, in terms of the electroluminescent device, only a partial area of the silver-bearing cathode layer may be stripped and removed, such that only a partial area of the electroluminescent material layer is analyzed in the region where the electroluminescent material layer is exposed.

Exemplarily, sputtering regions of the first sputtering source and the second sputtering source may be provided in the time-of-flight secondary ion mass spectrometry to control the stripping area of the silver-bearing cathode layer and the analysis region of the electroluminescent material layer.

Under the consideration that the electroluminescent device may further include an encapsulation layer stacked on the silver-bearing cathode layer, the electroluminescent device in FIG. 6 may, for example, further include an encapsulation layer 64 on the silver-bearing cathode layer 63. Regarding the case of including the encapsulation layer, the film layer analysis method according to the embodiment of the present disclosure further includes removing the encapsulation layer by using a blade before stripping the silver-bearing cathode layer, and then, stripping the silver-bearing cathode layer and analyzing the electroluminescent material layer according to the method according to the embodiments of the present disclosure.

In summary, the film layer analysis method according to the embodiments of the present disclosure can not only effectively and thoroughly strip and remove the silver-bearing cathode layer, but also obtain an electroluminescent material layer having a complete film layer structure. In addition, during analyzing the electroluminescent material layer, the analysis of the film layer at a specific position can be accurately positioned, such that the analysis efficiency is effectively improved.

Figure 12:
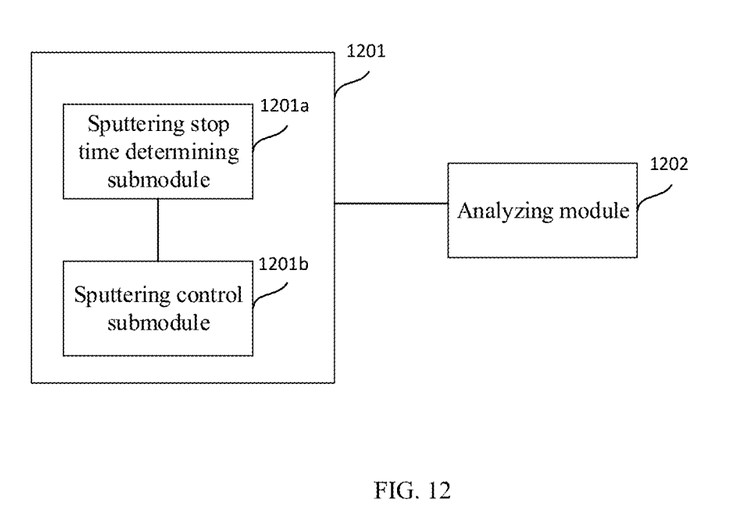
FIG. 12 is a diagram of a structure of an exemplary film layer analysis device for an electroluminescent device according to the present disclosure.

An embodiment of the present disclosure further provides a film layer analysis device for an electroluminescent device. FIG. 12 is a diagram of a structure of an exemplary film layer analysis device for an electroluminescent device according to the present disclosure. As shown in FIG. 12, the film layer analysis device includes a stripping module 1201 and an analyzing module 1202. The stripping module 1201 is configured to strip the silver-bearing cathode layer from the electroluminescent device by using a first ion sputtering source to obtain an analysis sample with the electroluminescent material layer exposed. The analyzing module 1202 is configured to analyze the exposed electroluminescent material layer by using a second ion sputtering source. The sputtering energy of the first ion sputtering source is greater than sputtering energy of the second ion sputtering source.

Optionally, the stripping module 1201 includes:

a sputtering stop time determining submodule 1201a, configured to determine a sputtering stop time based on a signal intensity-sputtering time graph, the signal intensity-sputtering time graph being generated while bombarding the silver-bearing cathode layer by using ions provided by the first ion sputtering source; and a sputtering control submodule 1201b, configured to stop bombarding the silver-bearing cathode layer by using ions provided by the first ion sputtering source at the sputtering stop time determined by the sputtering stop time determining submodule.

In a possible implementation, the sputtering stop time determining submodule 1201a is configured to determine an ion peak of a metal element of the non-silver metal sublayer in the signal intensity-sputtering time graph, and determine a time when the ion peak of the metal element of the non-silver metal sublayer occurs as the sputtering stop time.

In another possible implementation, the sputtering stop time determining submodule 1201a is configured to determine an ion peak of a silver element in the signal intensity-sputtering time graph, and determine the sputtering stop time according to a time when the ion peak of the silver element occurs, the sputtering stop time following and being spaced from the time when the ion peak of the silver element occurs by a predetermined time period.

Optionally, the first ion sputtering source is a dual-sputtering column DSC source, and the second ion sputtering source is a gas-cluster ion source.

Optionally, the first ion sputtering source is an oxygen source.

Optionally, the second ion sputtering source is an argon ion cluster source.

Optionally, the first ion sputtering source and the second ion sputtering source belong to a same mass spectrometry.

Optionally, the mass spectrometry is a time-of-flight secondary ion mass spectrometry.

Optionally, the analyzing module 1202 is configured to determine composition and a layer position of each film layer of the electroluminescent material layer on the basis of the signal intensity-sputtering time graph provided by the time-of-flight secondary ion mass spectrometry.

Optionally, the analyzing module 1202 is further configured to determine a layer position of each film layer of the electroluminescent material layer on the basis of a 3D rendering diagram, the 3D rendering diagram being provided by the time-of-flight secondary ion mass spectrometry for characterizing an analysis process.

Optionally, the analyzing module 1202 is further configured to determine element distribution of each film layer of the electroluminescent material layer through an element distribution diagram corresponding to the 3D rendering diagram provided by the time-of-flight secondary ion mass spectrometry.

For the specific working process and effect of each module of the film layer analysis device described above, a reference may be made to the corresponding process and effect in the foregoing method embodiment, and details are not repeated herein in the embodiment of the present disclosure.

An embodiment of the present disclosure further provides an apparatus for use in film layer analysis for an electroluminescent device including an anode layer, an electroluminescent material layer and a silver-bearing cathode layer that are sequentially laminated.

The film layer analysis apparatus includes:
a processor; and
a memory for storing at least one processor-executable instruction;
wherein the processor is configured to execute the at least one instruction stored in the memory to perform the film layer analysis method.

An embodiment of the present disclosure further provides a non-transitory computer readable storage medium in which at least one instruction is stored, wherein when the at least one instruction is executed on a processing component, the processing component is enabled to perform the film layer analysis method.

Described above are merely intended to facilitate understanding of the technical solutions of the present disclosure by those skilled in the art, and are not intended to limit the present disclosure. Any modification, equivalent replacement, improvement, or the like made according to the spirit and principle of the present disclosure shall be regarded as within the protection scope of the present disclosure.

What is claimed is:

1. A film layer analysis method for an electroluminescent device, the electroluminescent device comprising an anode layer, an electroluminescent material layer, and a silver-bearing cathode layer that are sequentially laminated;
the film layer analysis method comprising:
providing a first ion sputtering source and a second ion sputtering source, wherein the first ion sputtering source is a dual-sputtering column DSC source, and the second ion sputtering source is a gas-cluster ion source;
stripping the silver-bearing cathode layer from the electroluminescent device by using the first ion sputtering source to obtain an analysis sample with the electroluminescent material layer exposed; and
analyzing the exposed electroluminescent material layer by using the second ion sputtering source.

2. The film layer analysis method for the electroluminescent device according to claim 1, wherein stripping the silver-bearing cathode layer from the electroluminescent device by using the first ion sputtering source comprises:
determining a sputtering stop time based on a signal intensity-sputtering time graph, the signal intensity-sputtering time graph being generated while bombarding the silver-bearing cathode layer by using ions provided by the first ion sputtering source; and
stopping bombarding the silver-bearing cathode layer by using the ions provided by the first ion sputtering source at the sputtering stop time.

3. The film layer analysis method for the electroluminescent device according to claim 2, wherein the silver-bearing cathode layer comprises a non-silver metal sublayer and a silver-bearing metal sublayer sequentially disposed on the electroluminescent material layer;
determining the sputtering stop time on the basis of the signal intensity-sputtering time graph comprises:
determining an ion peak of a metal element of the non-silver metal sublayer in the signal intensity-sputtering time graph; and
determining a time when the ion peak of the metal element of the non-silver metal sublayer occurs as the sputtering stop time.

4. The film layer analysis method for the electroluminescent device according to claim 2, wherein determining the sputtering stop time on the basis of the signal intensity-sputtering time graph comprises:
determining an ion peak of a silver element in the signal intensity-sputtering time graph; and
determining the sputtering stop time according to the time when the ion peak of the silver element occurs, the sputtering stop time following and being spaced from the time when the ion peak of the silver element occurs by a predetermined time period.

5. The film layer analysis method for the electroluminescent device according to claim 1, wherein the first ion sputtering source is an oxygen source.

6. The film layer analysis method for the electroluminescent device according to claim 1, wherein the second ion sputtering source is an argon ion duster source.

7. The film layer analysis method for the electroluminescent device according to claim 1, wherein the first ion sputtering source and the second ion sputtering source belong to a same mass spectrometry.

8. The film layer analysis method for the electroluminescent device according to claim 7, wherein the mass spectrometry is a time-of-flight secondary ion mass spectrometry.

9. The film layer analysis method for the electroluminescent device according to claim 8, wherein the silver-bearing cathode layer comprises a Yb layer and an MgAg alloy layer sequentially disposed on the electroluminescent material layer; and
the method further comprises:
determining an ion peak of the Yb element based on a signal intensity-sputtering time graph provided by the time-of-flight secondary ion mass spectrometry; and
stopping the bombarding of the silver-bearing cathode layer when the ion peak of the Yb element occurs.

10. The film layer analysis method for the electroluminescent device according to claim 9, wherein the DSC source is an oxygen source, and the gas-cluster ion source is an argon ion cluster source;
wherein analyzing the exposed electroluminescent material layer by using the second ion sputtering source comprises:
determining composition and a layer position of each film layer of the electroluminescent material layer on the basis of the signal intensity-sputtering time graph provided by the time-of-flight secondary ion mass spectrometry;
determining a layer position of each film layer of the electroluminescent material layer on the basis of a 3D rendering diagram provided by the time-of-flight secondary ion mass spectrometry for characterizing an analysis process; and
determining element distribution of each film layer of the electroluminescent material layer through an element distribution diagram corresponding to the 3D rendering diagram provided by the time-of-flight secondary ion mass spectrometry.

11. The film layer analysis method for the electroluminescent device according to claim 8, wherein the DSC source is an oxygen source, and the gas-cluster ion source is an argon ion cluster source.

12. The film layer analysis method for the electroluminescent device according to claim 11, wherein analyzing the exposed electroluminescent material layer by using the second ion sputtering source comprises:
determining composition and a layer position of each film layer of the electroluminescent material layer on the basis of a signal intensity-sputtering time graph provided by the time-of-flight secondary ion mass spectrometry;
determining a layer position of each film layer of the electroluminescent material layer on the basis of a 3D rendering diagram provided by the time-of-flight secondary ion mass spectrometry for characterizing an analysis process; and
determining element distribution of each film layer of the electroluminescent material layer through an element distribution diagram corresponding to the 3D rendering diagram provided by the time-of-flight secondary ion mass spectrometry.

13. The film layer analysis method for the electroluminescent device according to claim 1, wherein analyzing the exposed electroluminescent material layer by using the second ion sputtering source comprises:
determining composition and a layer position of each film layer of the electroluminescent material layer on the basis of the signal intensity-sputtering time graph provided by the time-of-flight secondary ion mass spectrometry.

14. The film layer analysis method for the electroluminescent device according to claim 1, wherein analyzing the exposed electroluminescent material layer by using the second ion sputtering source comprises:
determining a layer position of each film layer of the electroluminescent material layer on the basis of a 3D rendering diagram provided by the time-of-flight secondary ion mass spectrometry for characterizing an analysis process.

15. The film layer analysis method for the electroluminescent device according to claim 1, wherein analyzing the exposed electroluminescent material layer by using the second ion sputtering source comprises:
determining element distribution of each film layer of the electroluminescent material layer through an element distribution diagram corresponding to the 3D rendering diagram provided by the time-of-flight secondary ion mass spectrometry.

16. The film layer analysis method for the electroluminescent device according to claim 1, wherein a stripping area of the silver-bearing cathode layer is greater than or equal to an analysis area of the electroluminescent material layer.

17. The film layer analysis method for the electroluminescent device according to claim 1, wherein the electroluminescent device further comprises an encapsulation layer laminated on the silver-bearing cathode layer; and
the film layer analysis method further comprises removing the encapsulation layer by using a blade before stripping the silver-bearing cathode layer.

18. An apparatus for use in film layer analysis for an electroluminescent device, the electroluminescent device comprising an anode layer, an electroluminescent material layer, and a silver-bearing cathode layer that are sequentially laminated,
the apparatus comprising:
a processor; and
a memory for storing at least one processor-executable instruction;
wherein the processor is configured to execute the at least one instruction stored in the memory to perform the film layer analysis method for the electroluminescent device as defined in claim 1.

19. A non-transitory computer readable storage medium storing at least one instruction, wherein when the at least one instruction is executed on a processing component, the processing component is enabled to perform the film layer analysis method for the electroluminescent device as defined in claim 1.

20. The film layer analysis method for the electroluminescent device according to claim 1, wherein the silver-bearing cathode layer comprises a Yb layer and an MgAg alloy layer sequentially disposed on the electroluminescent material layer, and
the method further comprises:
determining an ion peak of the Yb element based on a signal intensity-sputtering time graph, the signal intensity-sputtering time graph being generated while bombarding the silver-bearing cathode layer by using ions provided by the DSC source; and
stopping the bombarding of the silver-bearing cathode layer when the ion peak of the Yb element occurs.

* * * * *